United States Patent
Peng et al.

(10) Patent No.: US 11,516,910 B1
(45) Date of Patent: Nov. 29, 2022

(54) CIRCUIT BOARD STRUCTURE AND MANUFACTURING METHOD THEREOF

(71) Applicant: Unimicron Technology Corp., Taoyuan (TW)

(72) Inventors: Chia-Yu Peng, Taoyuan (TW); John Hon-Shing Lau, Taoyuan (TW); Kai-Ming Yang, Hsinchu County (TW); Pu-Ju Lin, Hsinchu (TW); Cheng-Ta Ko, Taipei (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 32 days.

(21) Appl. No.: 17/371,114

(22) Filed: Jul. 9, 2021

(51) Int. Cl.
| | |
|---|---|
| *H01R 12/52* | (2011.01) |
| *H05K 1/02* | (2006.01) |
| *H05K 1/11* | (2006.01) |
| *H05K 3/24* | (2006.01) |
| *H05K 3/06* | (2006.01) |
| *H05K 3/40* | (2006.01) |

(52) U.S. Cl.
CPC ........... *H05K 1/0296* (2013.01); *H05K 1/113* (2013.01); *H05K 3/06* (2013.01); *H05K 3/24* (2013.01); *H05K 3/4038* (2013.01); *H05K 2201/09481* (2013.01); *H05K 2203/072* (2013.01); *H05K 2203/095* (2013.01)

(58) Field of Classification Search
CPC ...... H01R 12/52; H05K 1/113; H05K 1/0296; H05K 3/06; H05K 3/24; H05K 3/4038
USPC .......................................................... 174/251
See application file for complete search history.

(56) References Cited

U.S. PATENT DOCUMENTS

| | | | |
|---|---|---|---|
| 6,558,780 B2 | 5/2003 | Suzuki et al. | |
| 6,768,064 B2 | 7/2004 | Higuchi et al. | |

FOREIGN PATENT DOCUMENTS

| | | |
|---|---|---|
| JP | 2013135032 | 7/2013 |
| TW | I729924 | 6/2021 |

OTHER PUBLICATIONS

"Office Action of Taiwan Counterpart Application", dated Feb. 21, 2022, p. 1-p. 5.

*Primary Examiner* — Tremesha S Willis
(74) *Attorney, Agent, or Firm* — JCIPRNET

(57) ABSTRACT

A circuit board structure includes a redistribution structure layer, a build-up circuit structure layer, and a connection structure layer. The redistribution structure layer has a first and second surface, and includes an inner and outer dielectric layer, first connecting pads, and chip pads. A bottom surface of each first connecting pad is aligned with the first surface, and the chip pads are protruded from and located on the second surface. The build-up circuit structure layer includes second connecting pads. The connection structure layer is disposed between the redistribution structure layer and the build-up circuit structure layer and includes a substrate and conductive paste pillars penetrating the substrate. The first connecting pads are electrically connected to the second connecting pads via the conductive paste pillars, respectively. A top surface of each conductive paste pillar is aligned with the first surface of the redistribution structure layer.

10 Claims, 15 Drawing Sheets

CIRCUIT BOARD STRUCTURE AND MANUFACTURING METHOD THEREOF

BACKGROUND OF THE INVENTION

Field of the Invention

The invention relates to a substrate structure and a manufacturing method thereof, and particularly relates to a circuit board structure and a manufacturing method thereof.

Description of Related Art

In general, two circuit boards with circuits or conductive structures are connected to each other via solder joints, and underfill is used to fill the gap between the two substrates to seal the solder joints. However, in the process of high-temperature reflow of the solder, a circuit board with a larger area size may not be released due to stress, and larger warpage is likely to occur, thereby reducing the assembly yield between the two circuit boards.

SUMMARY OF THE INVENTION

The invention provides a circuit board structure without using solder and underfill, thus reducing the cost and achieving better structural reliability.

The invention further provides a manufacturing method of a circuit board structure for manufacturing the above circuit board structure.

A circuit board structure of the invention includes a redistribution structure layer, a build-up circuit structure layer, and a connection structure layer. The redistribution structure layer has a first surface and a second surface opposite to each other, and includes an inner dielectric layer, an outer dielectric layer, a plurality of first connecting pads, and a plurality of chip pads. The inner dielectric layer has the first surface, and a bottom surface of each of the first connecting pads is aligned with the first surface. The outer dielectric layer has a second surface, and the chip pads are protruded from the second surface and located on the second surface. The build-up circuit structure layer is disposed at a side of the redistribution structure layer and includes a plurality of second connecting pads. A linewidth and a line spacing of the redistribution structure layer are smaller than a linewidth and a line spacing of the build-up circuit structure layer. The connection structure layer is disposed between the redistribution structure layer and the build-up circuit structure layer. The connection structure layer includes a substrate and a plurality of conductive paste pillars penetrating the substrate. The first connecting pads are electrically connected to the second connecting pads via the conductive paste pillars, respectively. A top surface of each of the conductive paste pillars is aligned with the first surface of the redistribution structure layer, and the second connecting pads are respectively embedded in the substrate.

In an embodiment of the invention, the redistribution structure layer further includes at least one dielectric layer, at least one redistribution circuit, and a plurality of conductive vias. The dielectric layer is located between the inner dielectric layer and the outer dielectric layer. The redistribution circuit and the dielectric layer are alternately disposed. The first connecting pads, the redistribution circuit, and the chip pads are electrically connected via the conductive vias.

In an embodiment of the invention, materials of the inner dielectric layer, the outer dielectric layer, and the dielectric layer respectively include a photosensitive dielectric material or an Ajinomoto build-up film (ABF).

In an embodiment of the invention, the circuit board structure further includes a surface treatment layer disposed on the chip pads of the redistribution structure layer. A material of the surface treatment layer includes an electroless nickel electroless palladium immersion gold (ENEPIG), an organic solderability preservative (OSP), or an electroless nickel immersion gold (ENIG).

In an embodiment of the invention, the circuit board structure further includes a solder mask disposed on a surface of the build-up circuit structure layer relatively far away from the connection structure layer and covering a portion of the build-up circuit structure layer to define a plurality of solder ball pads.

A manufacturing method of a circuit board structure of the invention includes the following steps. A redistribution structure layer is provided. The redistribution structure layer has a first surface and a second surface opposite to each other, and includes an inner dielectric layer, an outer dielectric layer, a plurality of first connecting pads, and a plurality of chip pads. The inner dielectric layer has the first surface, and a bottom surface of each of the first connecting pads is aligned with the first surface. The outer dielectric layer has a second surface, and the chip pads are protruded from the second surface and located on the second surface. A connection structure layer including a substrate and a plurality of conductive paste pillars penetrating the substrate is included, wherein the connection structure layer is in a B-stage state. A build-up circuit structure layer including a plurality of second connecting pads is provided, wherein a linewidth and a line spacing of the redistribution structure layer are smaller than a linewidth and a line spacing of the build-up circuit structure layer. The redistribution structure layer, the connection structure layer, and the build-up circuit structure layer are laminated so that the connection structure layer is located between the redistribution structure layer and the build-up circuit structure layer. The first connecting pads are electrically connected to the second connecting pads via the conductive paste pillars, respectively. A top surface of each of the conductive paste pillars is aligned with the first surface of the redistribution structure layer, the second connecting pads are respectively embedded in the substrate, and the connection structure layer is transformed from the B-stage state to a C-stage state.

In an embodiment of the invention, the step of providing the redistribution structure layer includes: providing a temporary substrate, a release film, and a first seed layer. The release film is located between the temporary substrate and the first seed layer. A first patterned photoresist layer is formed on the first seed layer, wherein the first patterned photoresist layer exposes a portion of the first seed layer. A first metal layer is electroplated on the first seed layer exposed by the first patterned photoresist layer using the first patterned photoresist layer as an electroplating mask. The first patterned photoresist layer and the first seed layer thereunder are removed to expose a portion of the release film and form the first connecting pads. The inner dielectric layer is formed on the first connecting pads and the exposed release film. At least one redistribution circuit, at least one dielectric layer, a plurality of first conductive vias, and a plurality of second conductive vias are formed. The redistribution circuit is disposed on the inner dielectric layer, and the redistribution circuit and the dielectric layer are alternately disposed. The first conductive vias pass through the inner dielectric layer and are electrically connected to the redistribution circuit and the first connecting pads. The second conductive via pass through the dielectric layer and are electrically connected to the redistribution circuit. The outer dielectric layer is formed on the redistribution circuit, wherein the outer dielectric layer has a plurality of openings, and the openings expose a portion of the redistribution circuit. A second seed layer is formed on the outer dielectric layer and on an inner wall of the openings. A second patterned photoresist layer is formed on the second seed layer, wherein the second patterned photoresist layer exposes a portion of the second seed layer. A second metal layer is electroplated on the second seed layer exposed by the second patterned photoresist layer using the second patterned photoresist layer as an electroplating mask. The second patterned photoresist layer is removed to expose the second seed layer and form the chip pads.

In an embodiment of the invention, before the redistribution structure layer, the connection structure layer, and the build-up circuit structure layer are laminated, an adhesion layer and a composite substrate are further laminated on the redistribution structure layer. The adhesion layer is located between the composite substrate and the chip pads of the redistribution structure layer. The composite substrate includes a core substrate and a first copper foil layer and a second copper foil layer located on two opposite surfaces of the composite substrate. The second copper foil layer is located between the core substrate and the adhesion layer. The temporary substrate and the release film are removed after the adhesion layer and the core substrate are laminated on the redistribution structure layer to expose the bottom surface of each of the first connecting pads and the first surface of the inner dielectric layer.

In an embodiment of the invention, after the redistribution structure layer, the connection structure layer, and the build-up circuit structure layer are laminated, a protective layer is further formed on a surface of the build-up circuit structure layer relatively far away from the connection structure layer. A de-boarding process is performed to remove the first copper foil layer and the core substrate. A first etching process is performed to remove the second copper foil layer to expose the adhesion layer. A peeling process is performed to remove the protective layer to expose the surface of the build-up circuit structure layer relatively far away from the connection structure layer. A plasma etching process is performed to remove the adhesion layer to expose the chip pads. A second etching process is performed to remove the second seed layer to expose the second surface of the outer dielectric layer. A surface treatment layer is formed on the chip pads of the redistribution structure layer, wherein a material of the surface treatment layer includes an electroless nickel electroless palladium immersion gold (ENEPIG), an organic solderability preservative (OSP), or an electroless nickel immersion gold (ENIG).

In an embodiment of the invention, before the redistribution structure layer, the connection structure layer, and the build-up circuit structure layer are laminated, a solder mask is further formed on a surface of the build-up circuit structure layer relatively far away from the connection structure layer. The solder mask covers a portion of the build-up circuit structure layer to define a plurality of solder ball pads.

Based on the above, in the manufacturing method of the circuit board structure of the invention, the circuit board structure is formed by laminating the redistribution structure layer, the connection structure layer, and the build-up circuit structure layer. The first connecting pads of the redistribution structure layer are respectively electrically connected to the second connecting pads of the build-up circuit structure layer via the conductive paste pillars of the connection structure layer. A top surface of each of the conductive paste pillars is aligned with the first surface of the redistribution structure layer, and the second connecting pads are respectively embedded in the substrate. Thereby, the manufacturing method of the circuit board structure of the invention does not need to use solder joints and underfill, thus effectively reducing the manufacturing cost of the circuit board structure. In addition, because no solder is used, the bonding yield between the redistribution structure layer, the connection structure layer, and the build-up circuit structure layer may be effectively improved, thereby improving the structural reliability of the circuit board structure of the invention.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
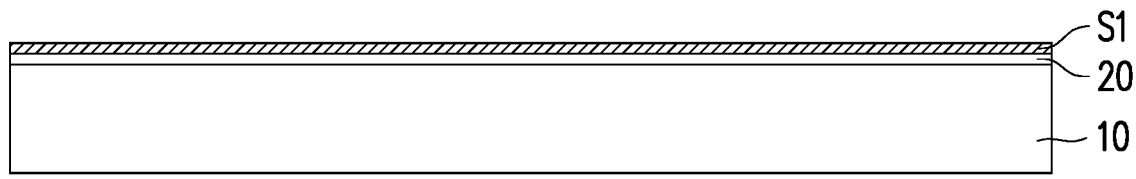
FIG. 1A to FIG. 1X are schematic cross-sectional views of a manufacturing method of a circuit board structure according to an embodiment of the invention.
Figure 1B:
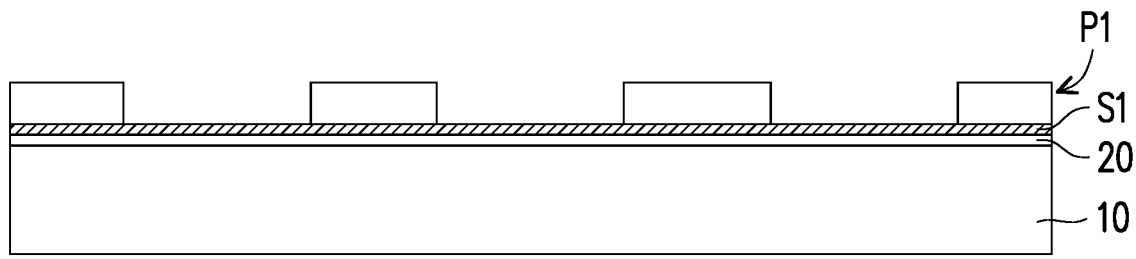
Figure 1C:
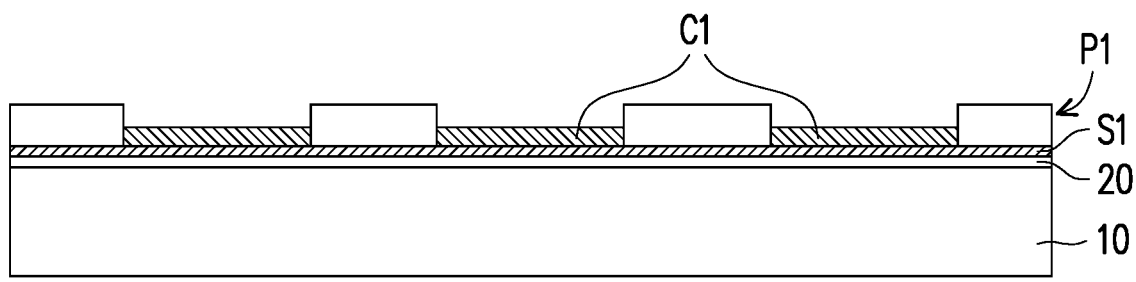
Figure 1D:
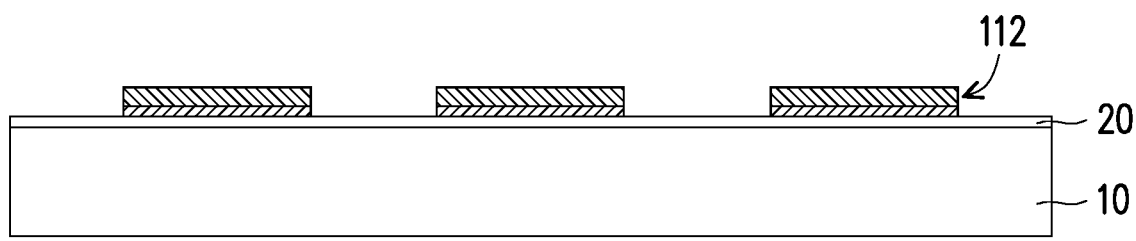
Figure 1E:
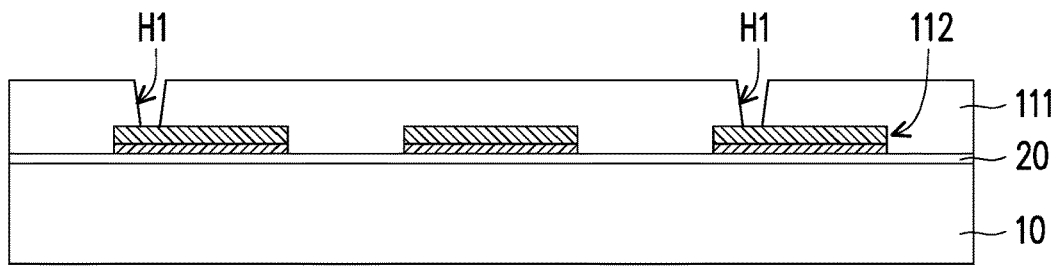
Figure 1F:
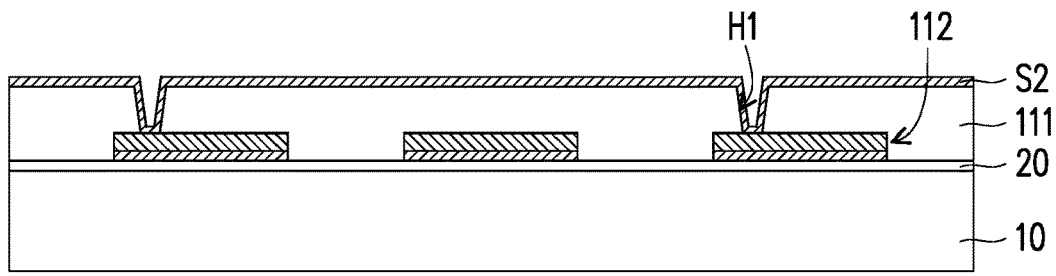
Figure 1G:
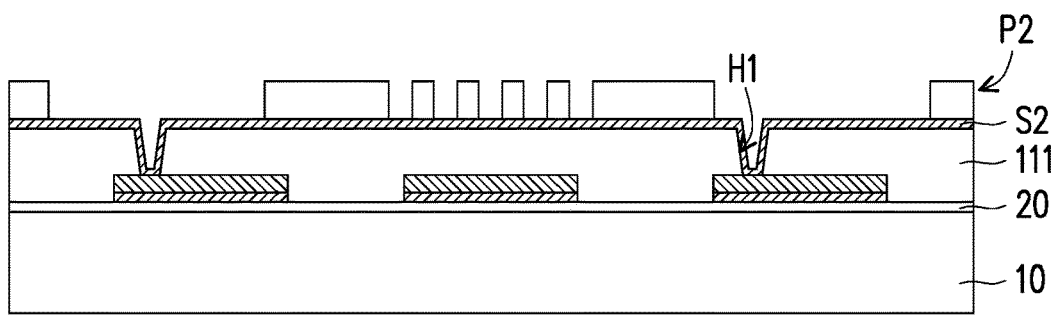
Figure 1H:
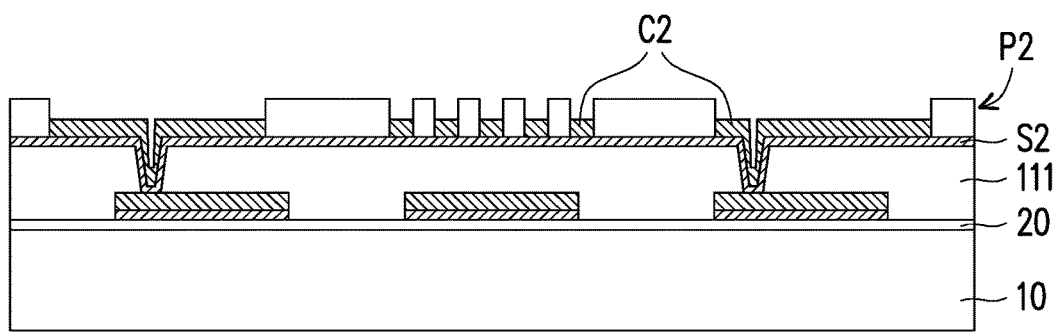
Figure 1I:
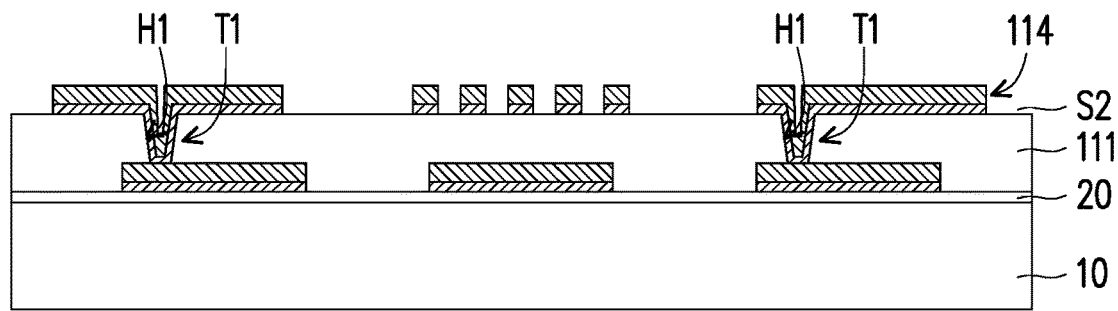
Figure 1J:
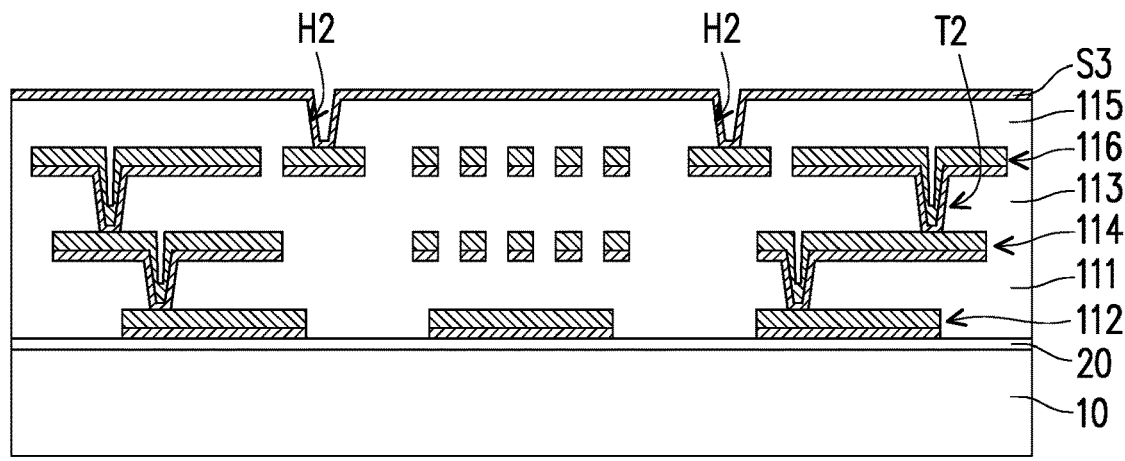
Figure 1K:
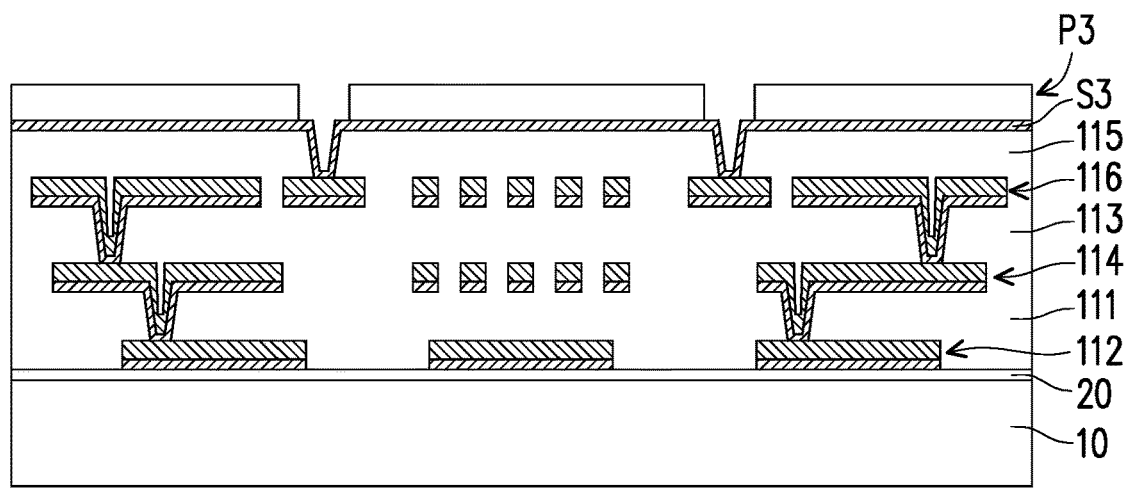
Figure 1L:
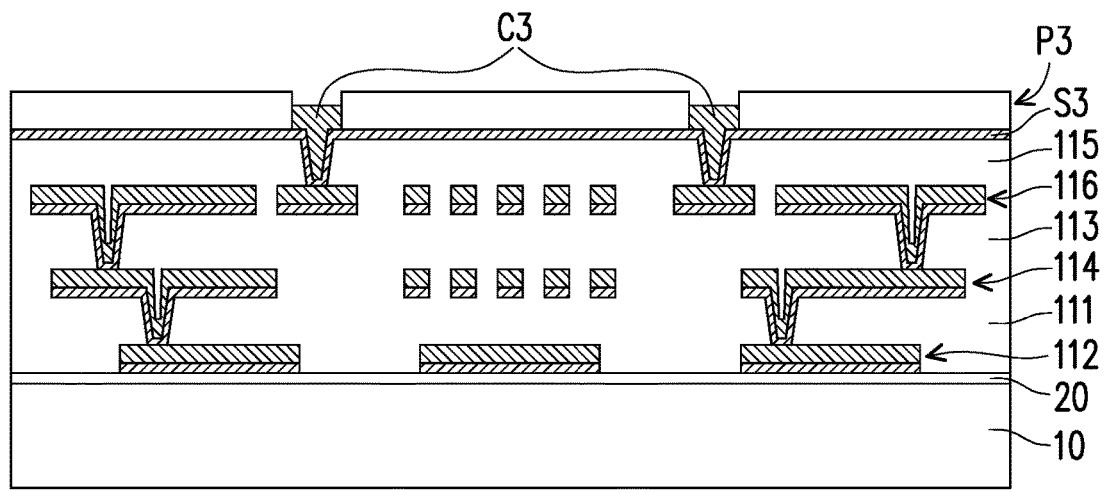
Figure 1M:
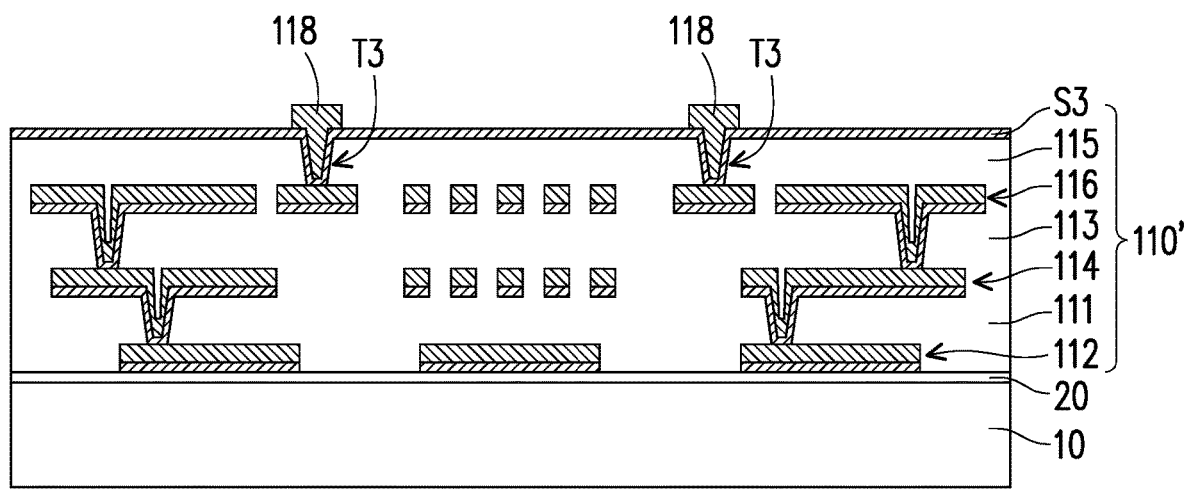
Figure 1N:
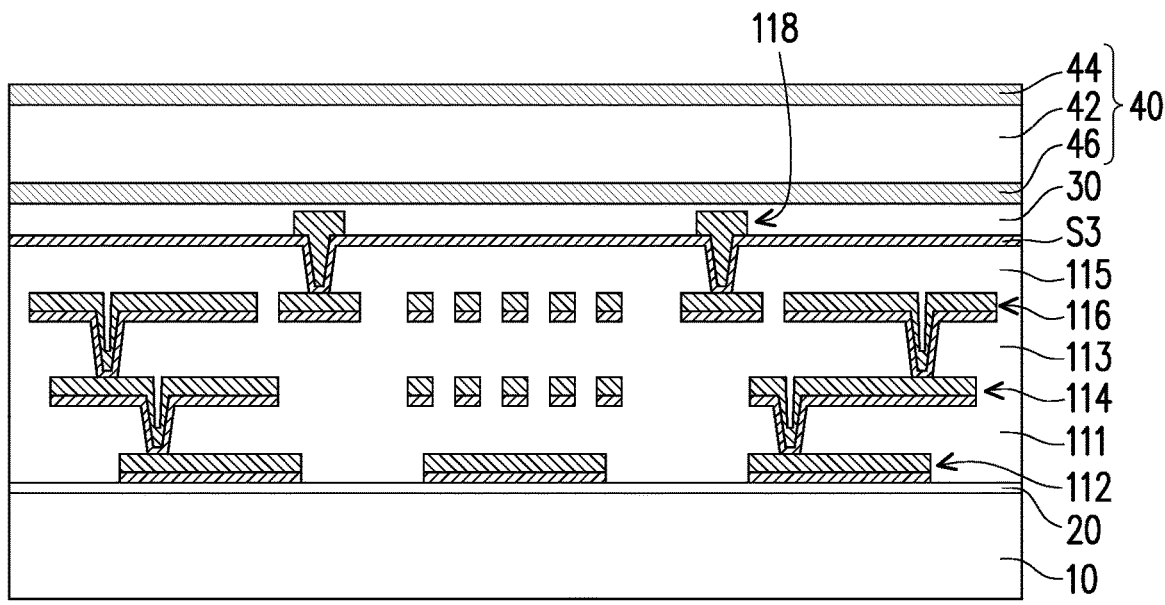
Figure 1O:
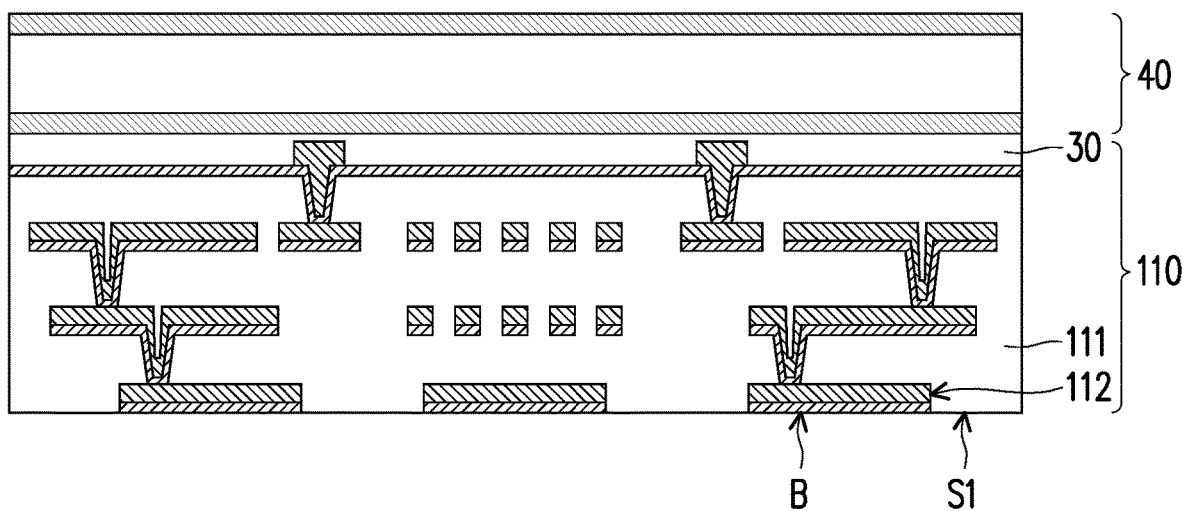
Figure 1P:
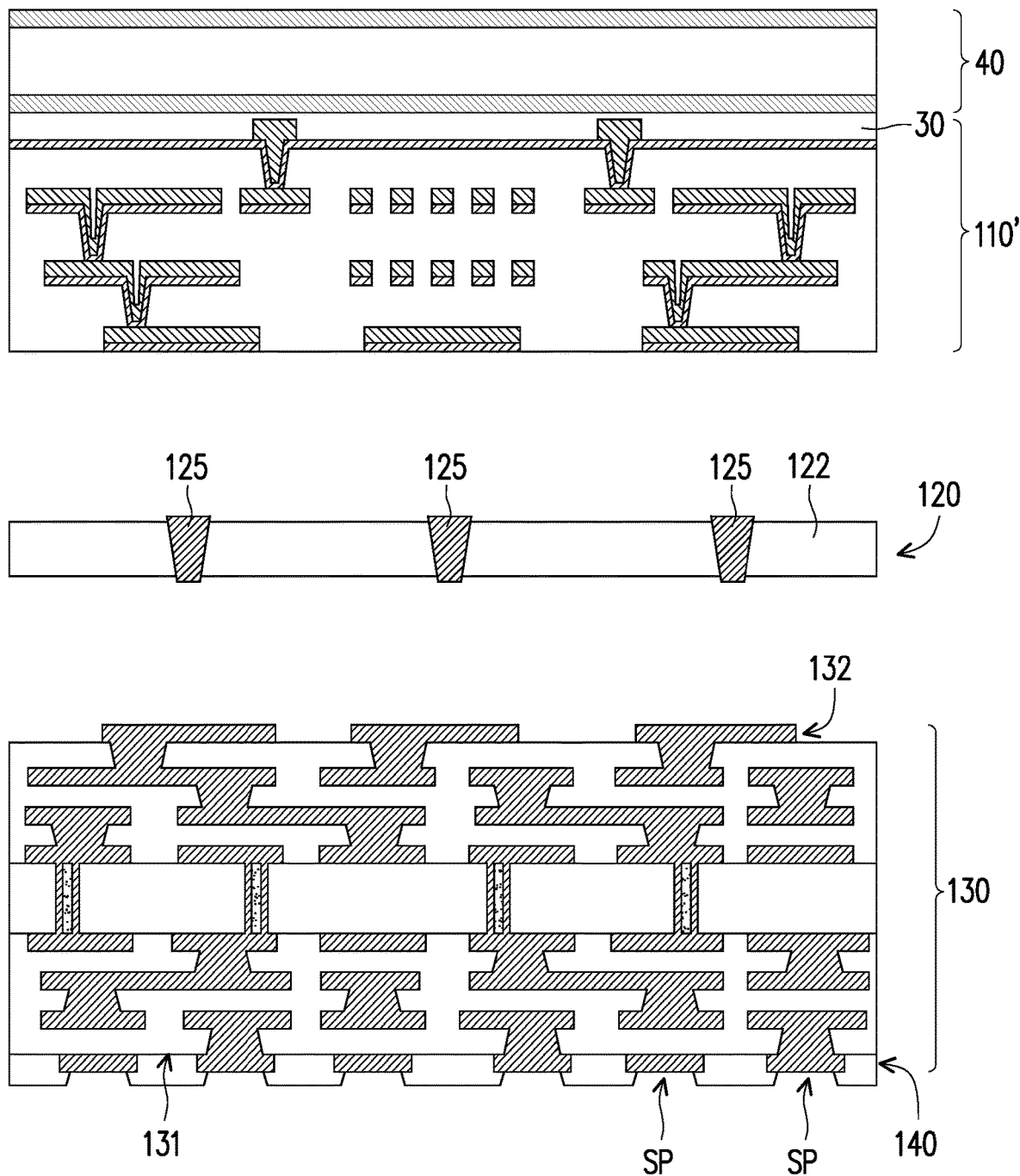
Figure 1Q:
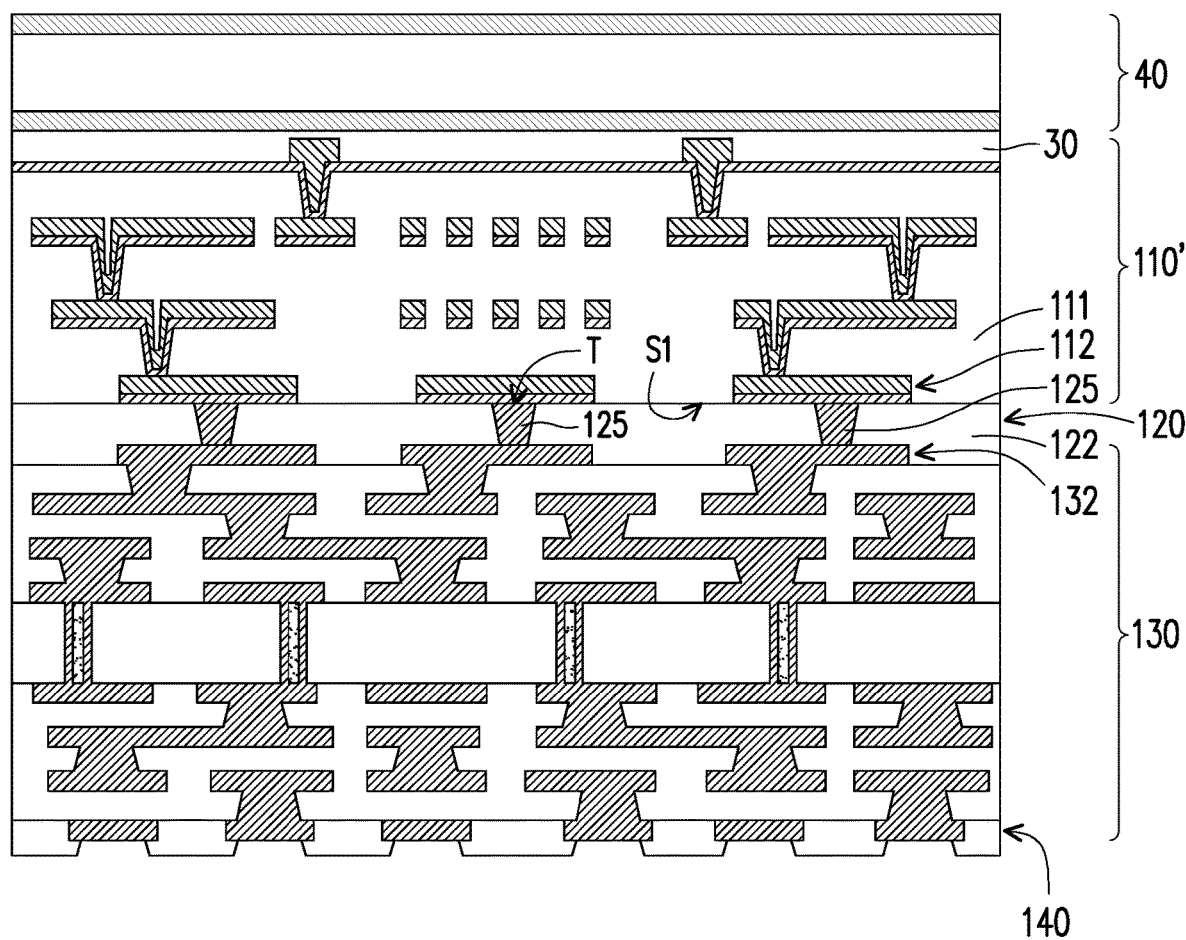
Figure 1R:
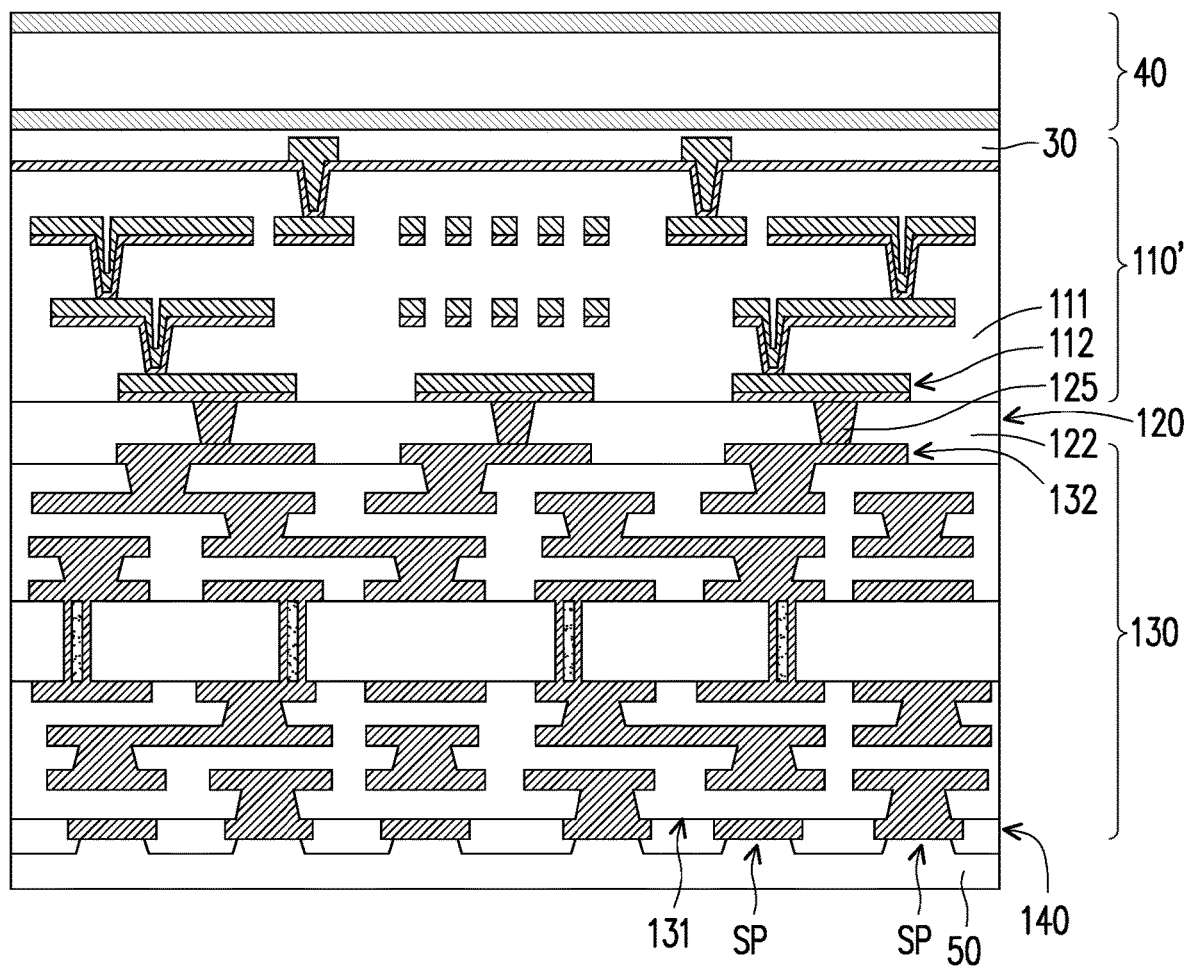
Figure 1S:
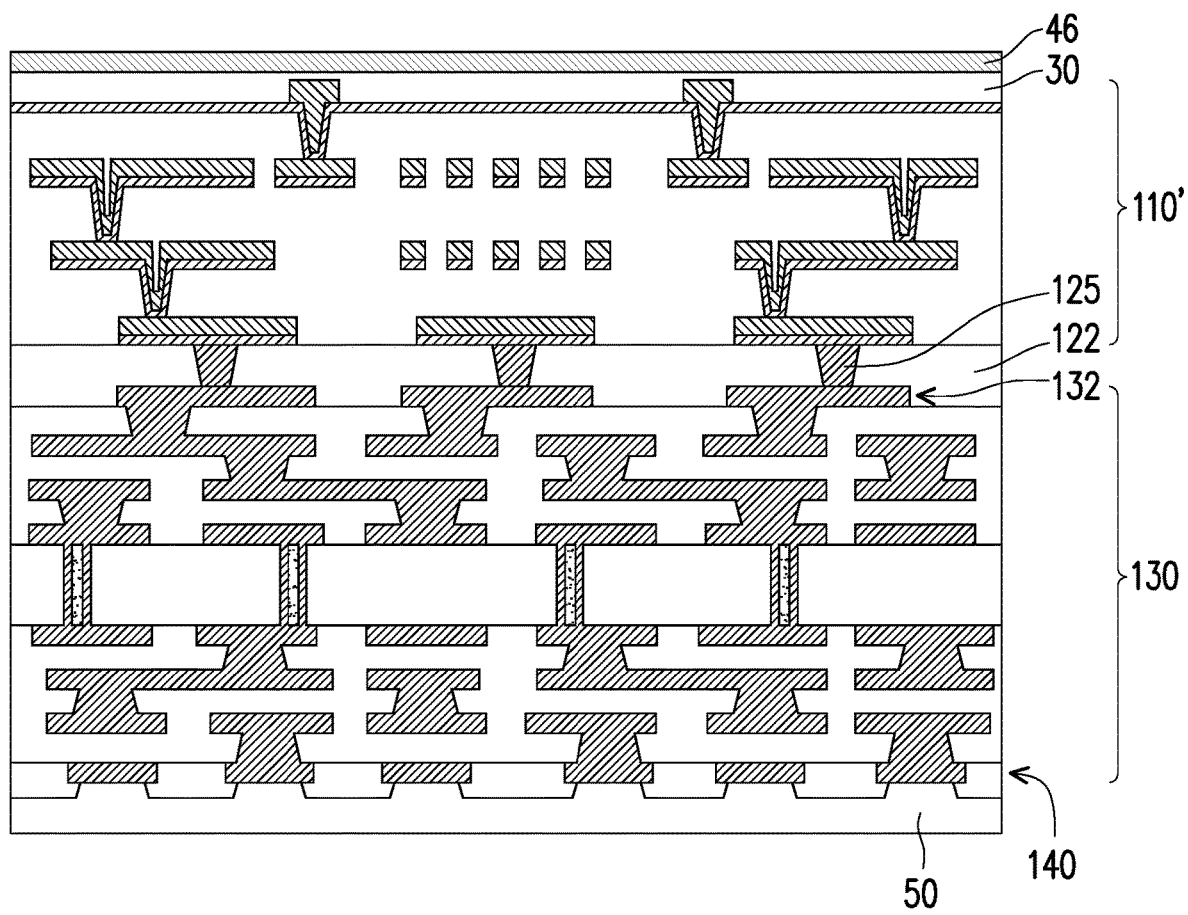
Figure 1T:
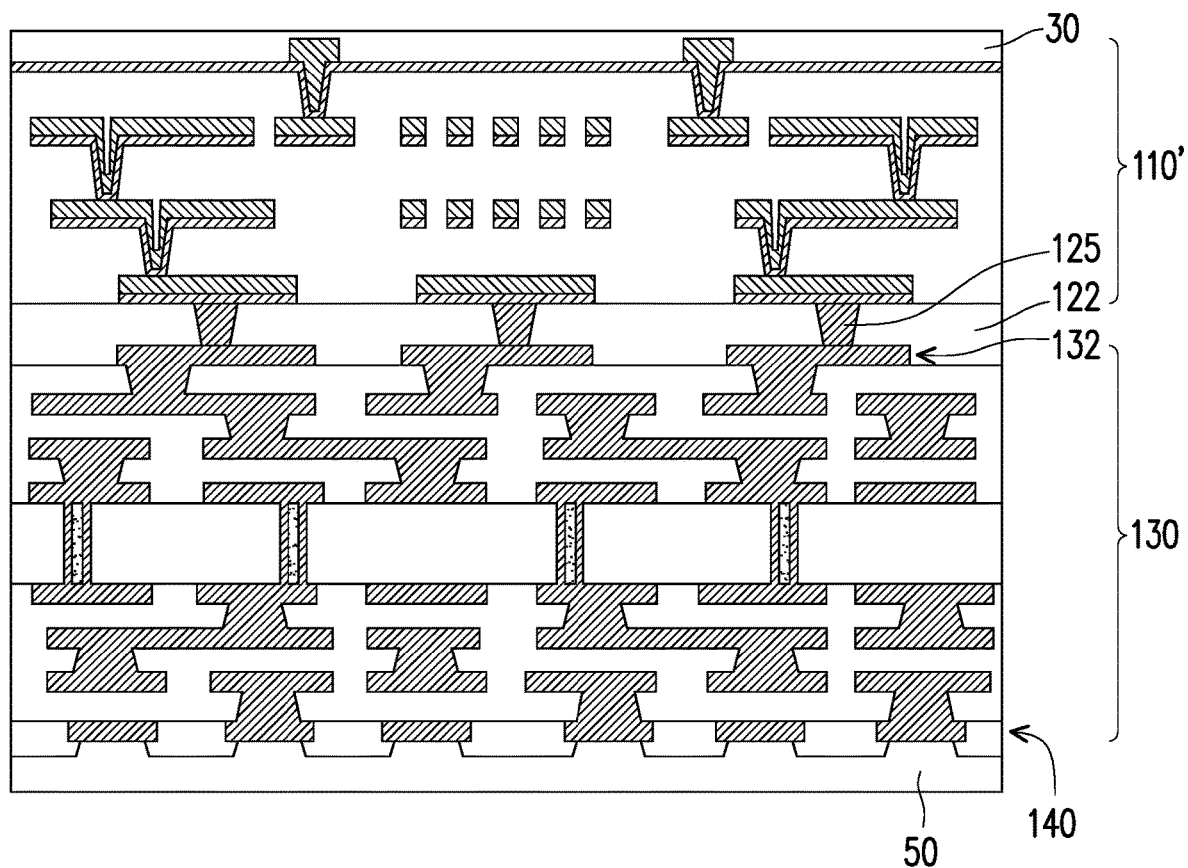
Figure 1U:
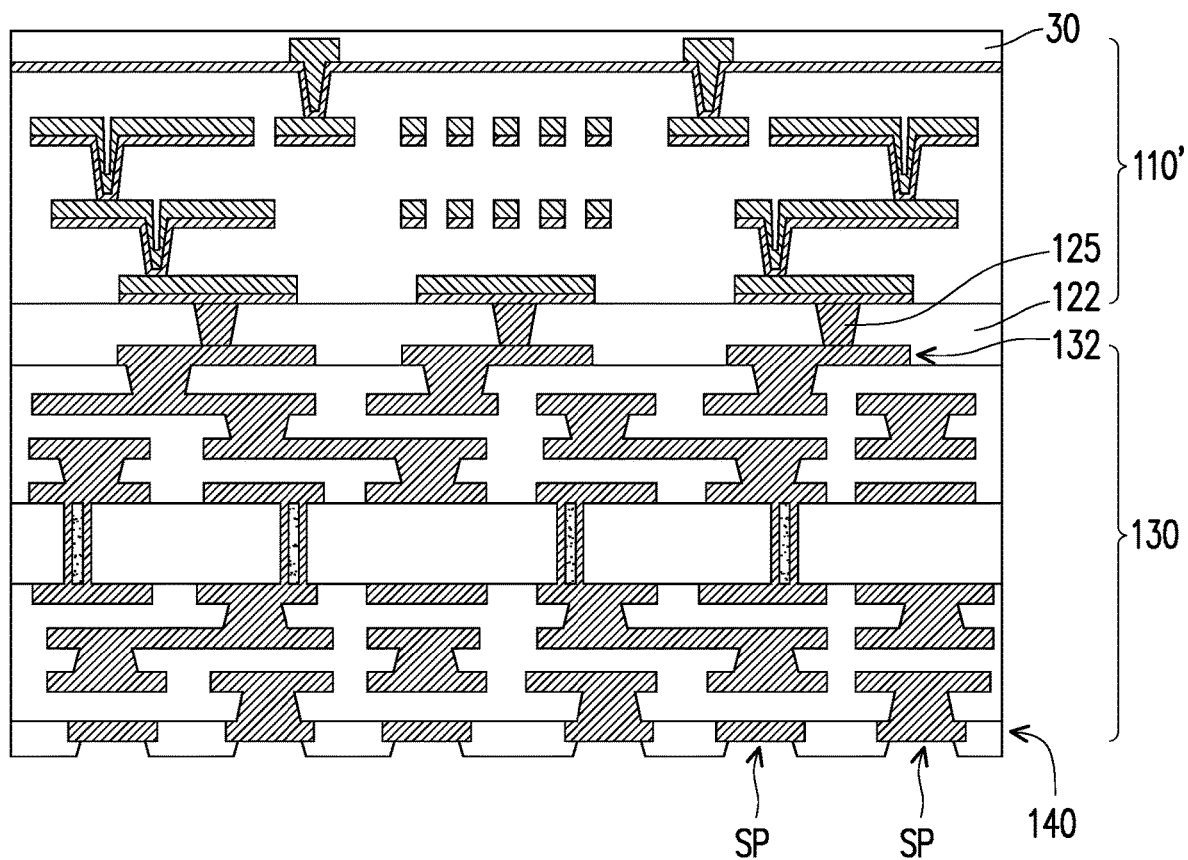
Figure 1V:
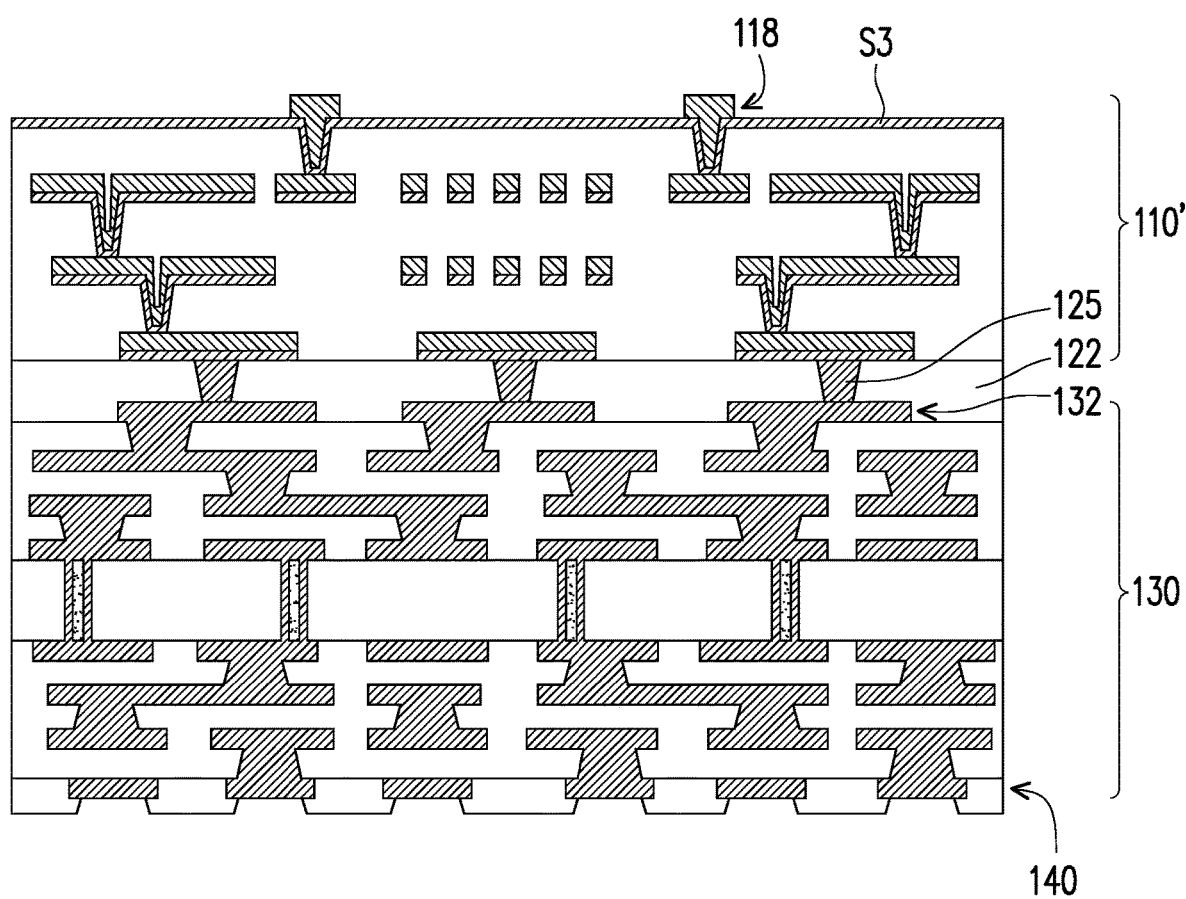
Figure 1W:
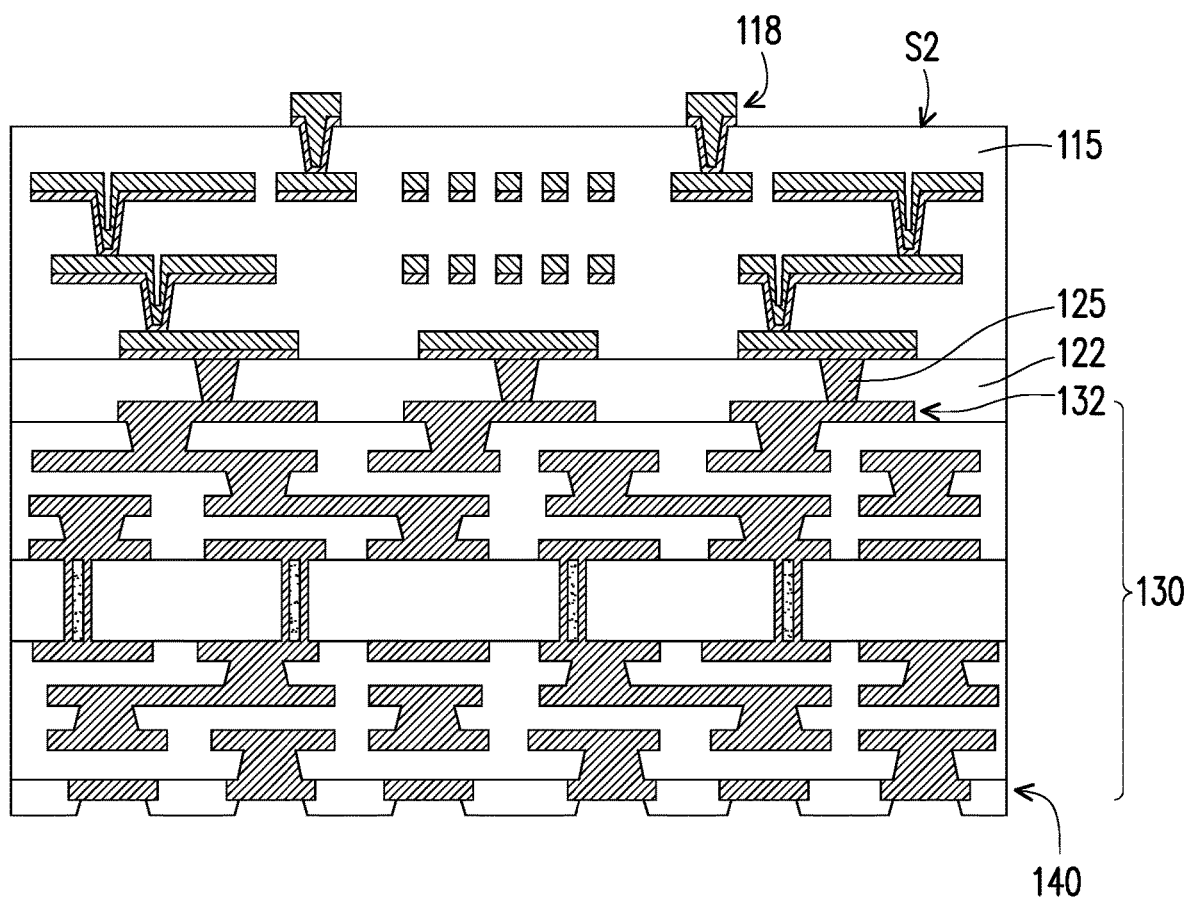
Figure 1X:
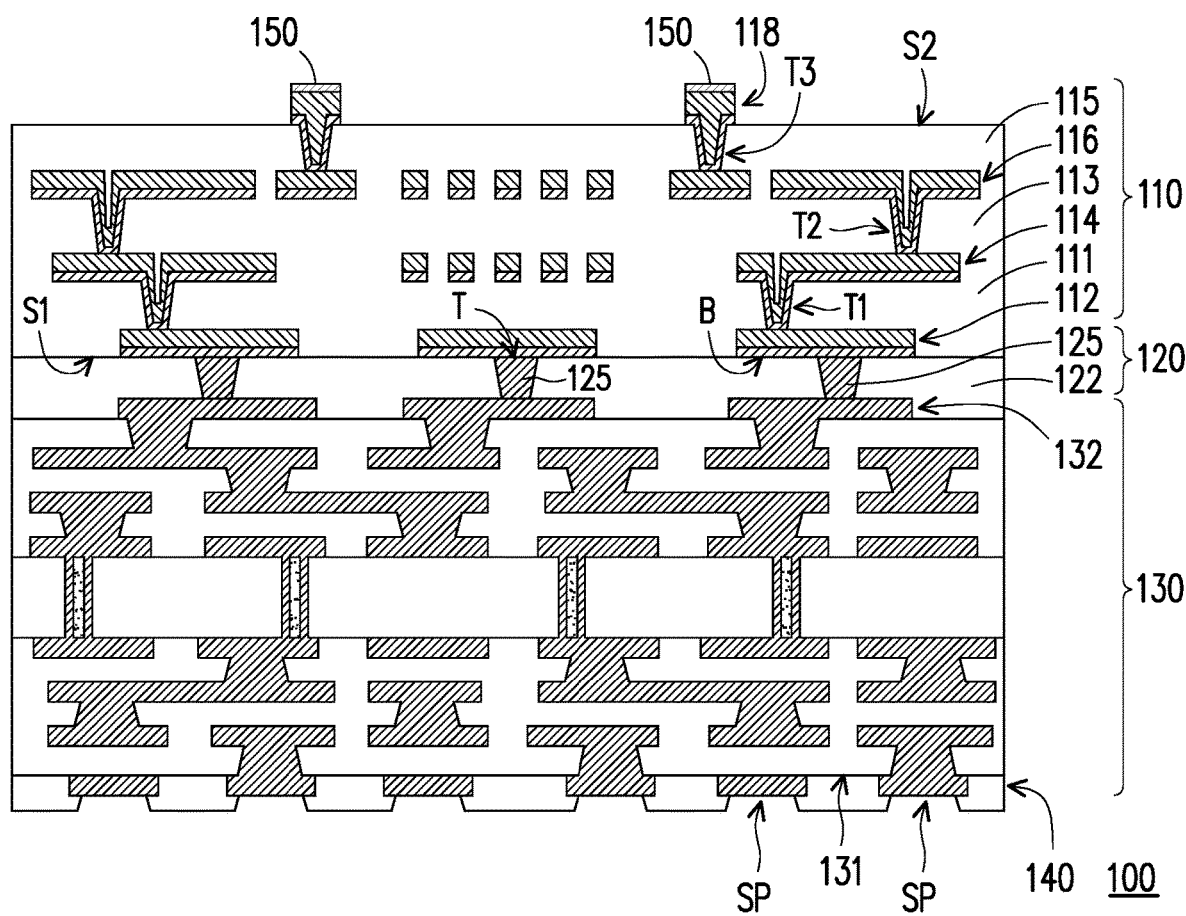
Figure 2:
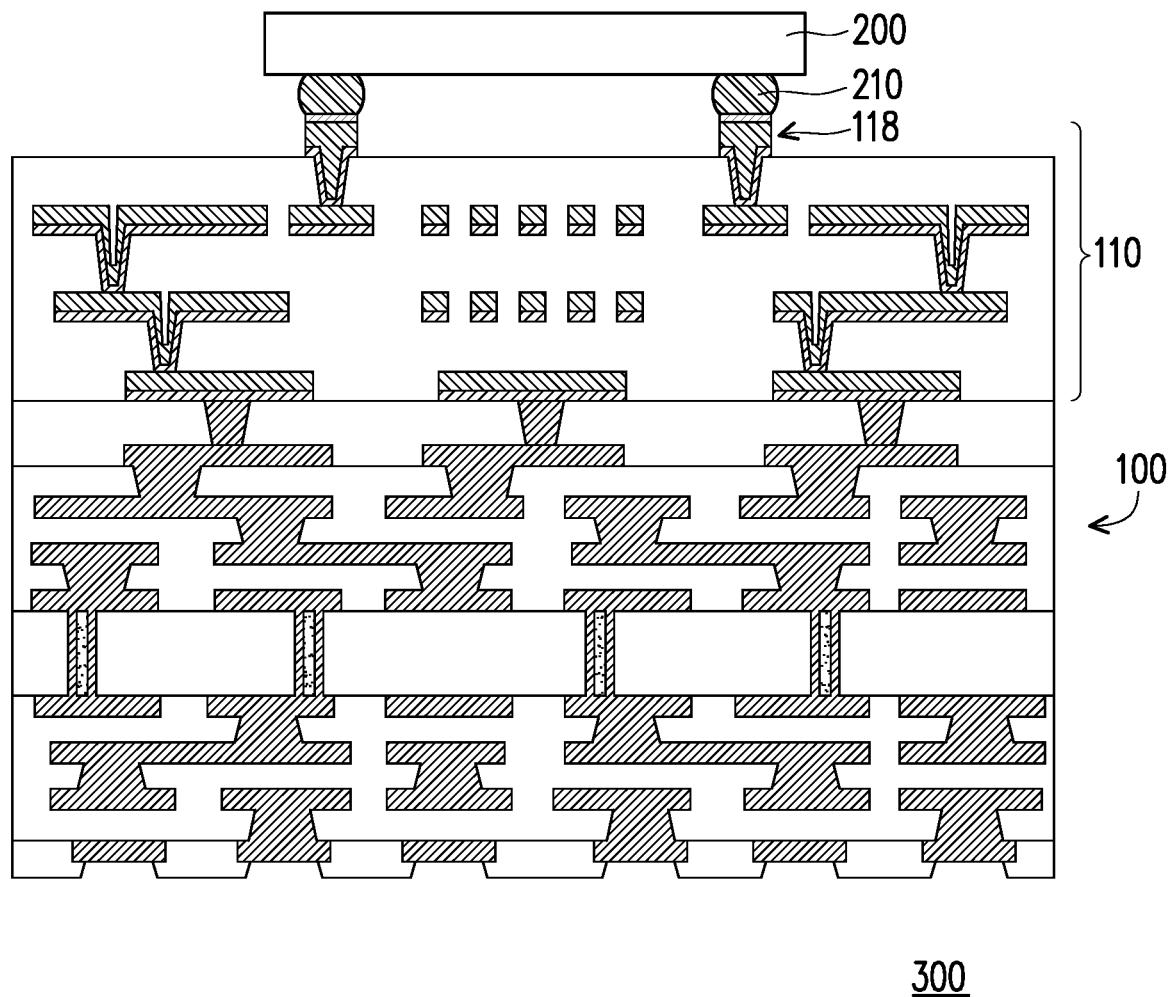
FIG. 2 is a schematic cross-sectional view of disposing a chip at the circuit board structure of FIG. 1X.

FIG. 1A to FIG. 1X are schematic cross-sectional views of a manufacturing method of a circuit board structure according to an embodiment of the invention. FIG. 2 is a schematic cross-sectional view of disposing a chip at the circuit board structure of FIG. 1X. Regarding the manufacturing method of the circuit board structure of the present embodiment, first, referring to FIG. 1A, a temporary substrate 10, a release film 20, and a seed layer Si are provided, wherein the release film 20 is located between the temporary substrate 10 and the seed layer S1. Here, the material of the temporary substrate 10 is, for example, glass or plastic, which is a substrate without a circuit.

Next, referring to FIG. 1B, a patterned photoresist layer P1 is formed on the seed layer S1, wherein the patterned photoresist layer P1 exposes a portion of the seed layer S1.

Next, referring to FIG. 1C, using the patterned photoresist layer P1 as an electroplating mask, a metal layer C1 is electroplated on the seed layer S1 exposed by the patterned photoresist layer P1. The material of the metal layer C1 is, for example, copper, but is not limited thereto.

Next, referring to FIG. 1C and FIG. 1D at the same time, the patterned photoresist layer P1 and the seed layer S1 thereunder are removed to expose a portion of the release film 20 and form first connecting pads 112.

Next, referring to FIG. 1E, an inner dielectric layer 111 is formed on the first connecting pads 112 and the exposed release film 20. The inner dielectric layer 111 has a plurality of openings H1, wherein the openings H1 expose a portion of the first connecting pads 112. The material of the inner dielectric layer 111 is, for example, a photosensitive dielectric material or an Ajinomoto build-up film (ABF).

Next, referring to FIG. 1F, a seed layer S2 is formed on the inner dielectric layer 111 and the inner wall of the openings H1, wherein the seed layer S2 is directly in contact with the first connecting pads 112 exposed by the openings H1.

Next, referring to FIG. 1G, a patterned photoresist layer P2 is formed on the seed layer S2, wherein the patterned photoresist layer P2 exposes a portion of the seed layer S2.

Next, referring to FIG. 1H, using the patterned photoresist layer P2 as an electroplating mask, a metal layer C2 is electroplated on the seed layer S2 exposed by the patterned photoresist layer P2. The material of the metal layer C2 is, for example, copper, but is not limited thereto.

Next, referring to both FIG. 1H and FIG. 1I, the patterned photoresist layer P2 and the seed layer S2 thereunder are removed, and a portion of the inner dielectric layer 111 is exposed, and a redistribution circuit 114 and a plurality of conductive vias T1 are formed. Here, the redistribution circuit 114 is located on the inner dielectric layer 111, and the conductive vias T1 pass through the inner dielectric layer 111 and are respectively located in the openings H1, wherein the conductive vias T1 are electrically connected to the first connecting pads 112 and the redistribution circuit 114.

Next, referring to FIG. 1J, the steps of FIG. 1E to FIG. 1I may be optionally repeated to form a dielectric layer 113, a redistribution circuit 116, a conductive via T2, and an outer dielectric layer 115. Here, the redistribution circuit 114, the dielectric layer 113, the redistribution circuit 116, and the outer dielectric layer 115 are alternately disposed in order. The conductive via T2 passes through the dielectric layer 113 and is electrically connected to the redistribution circuits 114 and 116. The outer dielectric layer 115 is formed on the redistribution circuit 116 and has a plurality of openings H2, wherein the openings H2 expose a portion of the redistribution circuit 116. Here, the materials of the outer dielectric layer 115 and the dielectric layer 113 are, for example, a photosensitive dielectric material or an Ajinomoto build-up film (ABF), respectively.

Right after, referring further to FIG. 1J, a seed layer S3 is formed on the outer dielectric layer 115 and the inner wall of the openings H2, wherein the seed layer S3 is directly in contact with the redistribution circuit 116 exposed by the openings H2.

Next, referring to FIG. 1K, a patterned photoresist layer P3 is formed on the seed layer S3, wherein the patterned photoresist layer P3 exposes a portion of the seed layer S3.

Next, referring to FIG. 1L, using the patterned photoresist layer P3 as an electroplating mask, a metal layer C3 is electroplated on the seed layer S3 exposed by the patterned photoresist layer P3. The material of the metal layer C3 is, for example, copper, but is not limited thereto.

Next, referring to FIG. 1M, the patterned photoresist layer P3 is removed to expose the seed layer S3 and to form a plurality of chip pads 118 and a plurality of conductive vias T3. Here, the chip pads 118 and the conductive vias T3 are formed at the same time and are of the same material. At this point, a redistribution structure layer semi-finished product 110' is complete.

Next, referring to FIG. 1N, an adhesion layer 30 and a composite substrate 40 are laminated on the seed layer S3. The adhesion layer 30 is located between the composite substrate 40 and the chip pads 118. The composite substrate 40 includes a core substrate 42 and a first copper foil layer 44 and a second copper foil layer 46 located on two opposite surfaces of the core substrate 42. The second copper foil layer 46 is located between the core substrate 42 and the adhesion layer 30.

Next, referring to both FIG. 1N and FIG. 1O, the temporary substrate 10 and the release film 20 are removed to expose the bottom surface B of each of the first connecting pads 112 and the first surface S1 of the inner dielectric layer 111.

Next, referring to FIG. 1P, a connection structure layer 120 including a substrate 122 and a plurality of conductive paste pillars 125 penetrating the substrate 122 is provided, wherein the connection structure layer 120 is in a B-stage state. Here, the material of the substrate 122 is, for example, prepreg (PP), and the material of the conductive paste pillars 125 is, for example, conductive metal paste. The substrate 122 and the conductive paste pillars 125 are coated and manufactured by a printing method to achieve the effect of electrical and thermal conductivity, and are suitable for bonding with any metal material.

Next, referring further to FIG. 1P, a build-up circuit structure layer 130 including a plurality of second connecting pads 132 is provided, wherein the linewidth and the line spacing of the redistribution structure layer semifinished product 110' are smaller than the linewidth and the line spacing of the build-up circuit structure layer 130. At this time, a solder mask 140 is formed on a surface 131 of the build-up circuit structure layer 130 relatively far away from the connection structure layer 120. The solder mask 140 covers a portion of the build-up circuit structure layer 130 to define a plurality of solder ball pads SP. Here, the build-up circuit structure layer 130 is embodied as a multi-layer circuit board.

It should be noted that the present embodiment does not limit the order of providing the redistribution structure layer semi-finished product 110', the connection structure layer 120, and the build-up circuit structure layer 130.

Next, referring to FIG. 1Q, the redistribution structure layer semi-finished product 110', the connection structure layer 120, and the build-up circuit structure layer 130 are laminated by means of hot pressing, so that the connection structure layer 120 is located between the redistribution structure layer semi-finished product 110' and the build-up circuit structure layer 130. At this time, the adhesion layer 30 and the composite substrate 40 are still located on the redistribution structure layer semi-finished product 110'. In particular, the first connecting pads 112 are electrically connected to the second connecting pads 132 via the conductive paste pillars 125, respectively. A top surface T of the conductive paste pillars 125 is aligned with the first surface S1 of the inner dielectric layer 111, and the second connecting pads 132 are respectively embedded in the substrate 122. During hot pressing, the redistribution structure layer semi-finished product 110' and the build-up circuit structure layer 130 are directly in contact with the substrate 122 of the connection structure layer 120 and extrude the conductive paste pillars 125 to deform the conductive paste pillars 125. Here, since the substrate 122 and the conductive paste pillars 125 are not fully cured and have flexibility and viscosity, the substrate 122 and the conductive paste pillars 125 may be bonded to the redistribution structure layer semi-finished product 110' and the build-up circuit structure layer 130, and the second connecting pads 132 are squeezed into the substrate 122 and embedded in the substrate 122. After lamination and curing, the substrate 122 and the conductive paste pillars 125 connected to the structure layer 120 are transformed from the B-stage state to a C-stage state.

Next, referring to FIG. 1R, a protective layer 50 is formed on the surface 131 of the build-up circuit structure layer 130 relatively far away from the connection structure layer 120. The protective layer 50 covers the solder mask 140 and the solder ball pads SP.

Next, referring to FIG. 1R and FIG. 1S at the same time, a de-boarding process is performed to remove the first copper foil layer 44 and the core substrate 42 of the composite substrate 40.

Next, referring to FIG. 1S and FIG. 1T at the same time, a first etching process is performed to remove the second copper foil layer 46 to expose the adhesion layer 30.

Next, referring to FIG. 1T and FIG. 1U at the same time, a peeling process is performed to remove the protective layer 50 to expose the solder mask 140 of the build-up circuit structure layer 130 and the solder ball pads SP.

Next, referring to FIG. 1U and FIG. 1V at the same time, a plasma etching process is performed to remove the adhesion layer 30 and expose the chip pads 118.

Next, referring to both FIG. 1V and FIG. 1W, a second etching process is performed to remove the seed layer S3 located outside the chip pads to expose the second surface S2 of the outer dielectric layer 115. At this point, the manufacture of the redistribution structure layer 110 is complete. Here, the redistribution structure layer 110 is embodied as a redistribution structure layer having a fine circuit.

Lastly, referring to FIG. 1X, a surface treatment layer 150 is formed on the chip pads 118 of the redistribution structure layer 110, wherein the material of the surface treatment layer 150 is, for example, electroless nickel electroless palladium immersion gold (ENEPIG), organic solder preservative (OSP), or electroless nickel immersion gold (ENIG). At this point, the manufacture of a circuit board structure 100 is complete.

In terms of structure, please refer further to FIG. 1X. In the present embodiment, the circuit board structure 100 includes the redistribution structure layer 110, the build-up circuit structure layer 130, and the connection structure layer 120. The redistribution structure layer 110 has the first surface S1 and the second surface S2 opposite to each other, and includes the inner dielectric layer 111, the outer dielectric layer 115, the first connecting pads 112, and the chip pads 118. The inner dielectric layer 111 has the first surface S1, and the bottom surface B of the first connecting pads 112 is aligned with the first surface S1. The outer dielectric layer 115 has the second surface S2, and the chip pads 118 are protruded from the second surface S2 and located on the second surface S2. The build-up circuit structure layer 130 is disposed at a side of the redistribution structure layer 110 and includes the second connecting pads 132. The linewidth and the line spacing of the redistribution structure layer 110 are smaller than the linewidth and the line spacing of the build-up circuit structure layer 130. The connection structure layer 120 is disposed between the redistribution structure layer 110 and the build-up circuit structure layer 130. The connection structure layer 120 includes the substrate 122 and the conductive paste pillars 125 penetrating the substrate 122. The first connecting pads 112 are electrically connected to the second connecting pads 132 via the conductive paste pillars 125, respectively. The top surface T of the conductive paste pillars 125 is aligned with the first surface S1 of the redistribution structure layer 110, and the second connecting pads 132 are respectively embedded in the substrate 122.

Furthermore, the redistribution structure layer 110 of the present embodiment further includes the dielectric layer 113, the redistribution circuits 114 and 116, and the conductive vias T1, T2, and T3. The dielectric layer 113 is located between the inner dielectric layer 111 and the outer dielectric layer 115. The redistribution circuits 114 and 116 and the dielectric layer 113 are alternately disposed. The first connecting pads 112, the redistribution circuits 114 and 116, and the chip pads 118 are electrically connected via the conductive vias T1, T2, and T3. Here, the materials of the inner dielectric layer 111, the outer dielectric layer 115, and the dielectric layer 113 are, for example, a photosensitive dielectric material or an Ajinomoto build-up film (ABF), respectively.

Furthermore, the circuit board structure 100 of the present embodiment further includes the surface treatment layer 150 disposed on the chip pads 118 of the redistribution structure layer 110. Here, the material of the surface treatment layer 150 is, for example, electroless nickel electroless palladium immersion gold, organic solder resist, or electroless nickel immersion gold. In addition, the circuit board structure 100 of the present embodiment further includes the solder mask 140 disposed on the surface 131 of the build-up circuit structure layer 130 relatively far away from the connection structure layer 120 and covering a portion of the build-up circuit structure layer 130 to define the plurality of solder ball pads SP.

In short, since in the present embodiment, the circuit board structure 100 is formed by laminating the redistribution structure layer 110, the connection structure layer 120, and the build-up circuit structure layer 130, there is no need to use solder and underfill, thus effectively reducing the manufacturing cost of the circuit board structure 100. In addition, because no solder joint is used, the bonding yield between the redistribution structure layer 110, the connection structure layer 120, and the build-up circuit structure layer 130 may be effectively improved, thereby improving the structural reliability of the circuit board structure 100 of the present embodiment.

In terms of application, please refer to FIG. 2, at least one chip 200 may be electrically connected to the chip pads 118 of the redistribution structure layer 110 via a solder 210 to form a chip package structure 300.

Based on the above, in the manufacturing method of the circuit board structure of the invention, the circuit board structure is formed by laminating the redistribution structure layer, the connection structure layer, and the build-up circuit structure layer. The first connecting pads of the redistribution structure layer are respectively electrically connected to the second connecting pads of the build-up circuit structure layer via the conductive paste pillars of the connection structure layer. The top surface of each of the conductive paste pillars is aligned with the first surface of the redistribution structure layer, and the second connecting pads are respectively embedded in the substrate. Thereby, the manufacturing method of the circuit board structure of the invention does not need to use solder joints and underfill, thus effectively reducing the manufacturing cost of the circuit board structure. In addition, because no solder is used, the bonding yield between the redistribution structure layer, the connection structure layer, and the build-up circuit structure layer may be effectively improved, thereby improving the structural reliability of the circuit board structure of the invention.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A circuit board structure, comprising:
a redistribution structure layer having a first surface and a second surface opposite to each other and comprising an inner dielectric layer, an outer dielectric layer, a plurality of first connecting pads, and a plurality of chip pads, wherein the inner dielectric layer has the first surface, a bottom surface of each of the first connecting pads is aligned with the first surface, the outer dielectric layer has the second surface, and the chip pads are protruded from the second surface and located on the second surface;
a build-up circuit structure layer disposed at a side of the redistribution structure layer and comprising a plurality of second connecting pads, wherein a linewidth and a line spacing of the redistribution structure layer are smaller than a linewidth and a line spacing of the build-up circuit structure layer; and
a connection structure layer disposed between the redistribution structure layer and the build-up circuit structure layer and comprising a substrate and a plurality of conductive paste pillars penetrating the substrate, wherein the first connecting pads are electrically connected to the second connecting pads via the conductive paste pillars, respectively, a top surface of each of the conductive paste pillars is aligned with the first surface of the redistribution structure layer, and the second connecting pads are respectively embedded in the substrate.

2. The circuit board structure of claim 1, wherein the redistribution structure layer further comprises at least one dielectric layer, at least one redistribution circuit, and a plurality of conductive vias, the at least one dielectric layer is located between the inner dielectric layer and the outer dielectric layer, the at least one redistribution circuit and the at least one dielectric layer are alternately disposed, and the first connecting pads, the at least one redistribution circuit, and the chip pads are electrically connected via the conductive vias.

3. The circuit board structure of claim 2, wherein materials of the inner dielectric layer, the outer dielectric layer, and the at least one dielectric layer comprise a photosensitive dielectric material or an Ajinomoto deposition film, respectively.

4. The circuit board structure of claim 1, further comprising:
a surface treatment layer disposed on the chip pads of the redistribution structure layer, wherein a material of the surface treatment layer comprises an electroless nickel electroless palladium immersion gold, an organic solder resist, or an electroless nickel immersion gold.

5. The circuit board structure of claim 1, further comprising:
a solder mask disposed on a surface of the build-up circuit structure layer relatively far away from the connection structure layer and covering a portion of the build-up circuit structure layer to define a plurality of solder ball pads.

6. A manufacturing method of a circuit board structure, comprising:
providing a redistribution structure layer, wherein the redistribution structure layer has a first surface and a second surface opposite to each other and comprises an inner dielectric layer, an outer dielectric layer, a plurality of first connecting pads, and a plurality of chip pads, the inner dielectric layer has the first surface, a bottom surface of each of the first connecting pads is aligned with the first surface, the outer dielectric layer has the second surface, and the chip pads are protruded from the second surface and located on the second surface;
providing a connection structure layer comprising a substrate and a plurality of conductive paste pillars penetrating the substrate, wherein the connection structure layer is in a B-stage state;
providing a build-up circuit structure layer comprising a plurality of second connecting pads, wherein a linewidth and a line spacing of the redistribution structure layer are smaller than a linewidth and a line spacing of the build-up circuit structure layer; and
laminating the redistribution structure layer, the connection structure layer, and the build-up circuit structure layer so that the connection structure layer is located between the redistribution structure layer and the build-up circuit structure layer, wherein the first connecting pads are respectively electrically connected to the second connecting pads via the conductive paste pillars, a top surface of each of the conductive paste pillars is aligned with the first surface of the redistribution structure layer, the second connecting pads are respectively embedded in the substrate, and the connection structure layer is transformed from the B-stage state to a C-stage state.

7. The manufacturing method of the circuit board structure of claim 6, wherein the step of providing the redistribution structure layer comprises:
providing a temporary substrate, a release film, and a first seed layer, wherein the release film is located between the temporary substrate and the first seed layer;
forming a first patterned photoresist layer on the first seed layer, wherein the first patterned photoresist layer exposes a portion of the first seed layer;
electroplating a first metal layer on the first seed layer exposed by the first patterned photoresist layer using the first patterned photoresist layer as an electroplating mask;
removing the first patterned photoresist layer and the first seed layer thereunder to expose a portion of the release film and form the first connecting pads;
forming the inner dielectric layer on the first connecting pads and the exposed release film;
forming at least one redistribution circuit, at least one dielectric layer, a plurality of first conductive vias, and a plurality of second conductive vias, wherein the at least one redistribution circuit is disposed on the inner dielectric layer, and the at least one redistribution circuit and the at least one dielectric layer are alternately disposed, the first conductive vias pass through the inner dielectric layer and are electrically connected to the at least one redistribution circuit and the first connecting pads, and the second conductive vias pass through the at least one dielectric layer and are electrically connected to the at least one redistribution circuit;
forming the outer dielectric layer on the at least one redistribution circuit, wherein the outer dielectric layer has a plurality of openings, and the openings expose a portion of the at least one redistribution circuit;
forming a second seed layer on the outer dielectric layer and on an inner wall of the openings;
forming a second patterned photoresist layer on the second seed layer, wherein the second patterned photoresist layer exposes a portion of the second seed layer;

electroplating a second metal layer on the second seed layer exposed by the second patterned photoresist layer using the second patterned photoresist layer as an electroplating mask; and removing the second patterned photoresist layer to expose the second seed layer and form the chip pads.

8. The manufacturing method of the circuit board structure of claim 7, further comprising, before laminating the redistribution structure layer, the connection structure layer, and the build-up circuit structure layer:

laminating an adhesion layer and a composite substrate on the redistribution structure layer, wherein the adhesion layer is located between the composite substrate and the chip pads of the redistribution structure layer, and the composite substrate comprises a core substrate and a first copper foil layer and a second copper foil layer located on two opposite surfaces of the core substrate, and the second copper foil layer is located between the composite substrate and the adhesion layer; and removing the temporary substrate and the release film after laminating the adhesion layer and the composite substrate on the redistribution structure layer to expose the bottom surface of each of the first connecting pads and the first surface of the inner dielectric layer.

9. The manufacturing method of the circuit board structure of claim 8, further comprising, after laminating the redistribution structure layer, the connection structure layer, and the build-up circuit structure layer:

forming a protective layer on a surface of the build-up circuit structure layer relatively far away from the connection structure layer;

performing a de-boarding process to remove the first copper foil layer and the core substrate of the composite substrate;

performing a first etching process to remove the second copper foil layer to expose the adhesion layer;

performing a peeling process to remove the protective layer to expose the surface of the build-up circuit structure layer relatively far away from the connection structure layer;

performing a plasma etching process to remove the adhesion layer to expose the chip pads;

performing a second etching process to remove the second seed layer to expose the second surface of the outer dielectric layer; and forming a surface treatment layer on the chip pads of the redistribution structure layer, wherein a material of the surface treatment layer comprises an electroless nickel electroless palladium immersion gold, an organic solder resist, or an electroless nickel immersion gold.

10. The manufacturing method of the circuit board structure of claim 6, further comprising, before laminating the redistribution structure layer, the connection structure layer, and the build-up circuit structure layer:

forming a solder mask on a surface of the build-up circuit structure layer relatively far away from the connection structure layer, wherein the solder mask covers a portion of the build-up circuit structure layer to define a plurality of solder ball pads.

* * * * *